(12) United States Patent
Yamazaki

(10) Patent No.: US 6,432,561 B1
(45) Date of Patent: Aug. 13, 2002

(54) EL DISPLAY DEVICE AND METHOD OF MANUFACTURING THE SAME

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/615,264

(22) Filed: Jul. 13, 2000

(30) Foreign Application Priority Data

Jul. 23, 1999 (JP) .......................................... 11-209227

(51) Int. Cl.⁷ .............................................. H05B 33/00
(52) U.S. Cl. ...................... 428/690; 313/502; 313/506; 257/102
(58) Field of Search ................................. 428/690, 917; 313/502–506; 257/101, 102, 103; 252/301.33, 299.2

(56) References Cited

U.S. PATENT DOCUMENTS

| | | | | |
|---|---|---|---|---|
| 4,885,211 A | * | 12/1989 | Tang et al. .................. | 428/457 |
| 5,047,687 A | * | 9/1991 | VanSlyke ..................... | 313/503 |
| 5,684,365 A | * | 11/1997 | Tang et al. .................. | 315/169.3 |
| 6,064,151 A | * | 5/2000 | Choong et al. .............. | 313/504 |
| 6,114,088 A | * | 9/2000 | Wolk et al. ................. | 430/273.1 |
| 6,137,223 A | * | 10/2000 | Hung et al. .................. | 313/506 |
| 6,169,359 B1 | * | 1/2001 | Sun et al. .................... | 313/503 |
| 6,188,134 B1 | * | 2/2001 | Stumborg et al. ........... | 257/751 |
| 6,221,701 B1 | * | 4/2001 | Yamazaki .................... | 438/166 |
| 6,259,138 B1 | * | 7/2001 | Ohtani et al. ............... | 257/351 |

OTHER PUBLICATIONS

U.S. application No. 09/619,485 including specification, claims, abstract, drawing and PTO Filing Receipt, pending.*

* cited by examiner

*Primary Examiner*—Cynthia H. Kelly
*Assistant Examiner*—Dawn Garrett
(74) *Attorney, Agent, or Firm*—Cook, Alex, McFarron, Manzo, Cummings & Mehler, Ltd.

(57) ABSTRACT

To decrease the number of layers while keeping or improving the performance of an EL element, so that the production cost is reduced. Cathodes (106, 107), a light emitting layer (108), an anode (109), and a passivation film (110) are formed on pixel electrodes (104, 105). Thereafter, the vicinity of the interface between the light emitting layer (108) and the anode (109) are doped with a halogen element through the passivation film (110) and the anode (109). This leads to formation of a hole conveying region (111) that functions as a hole conveying layer, thereby enhancing the light emission efficiency.

53 Claims, 8 Drawing Sheets

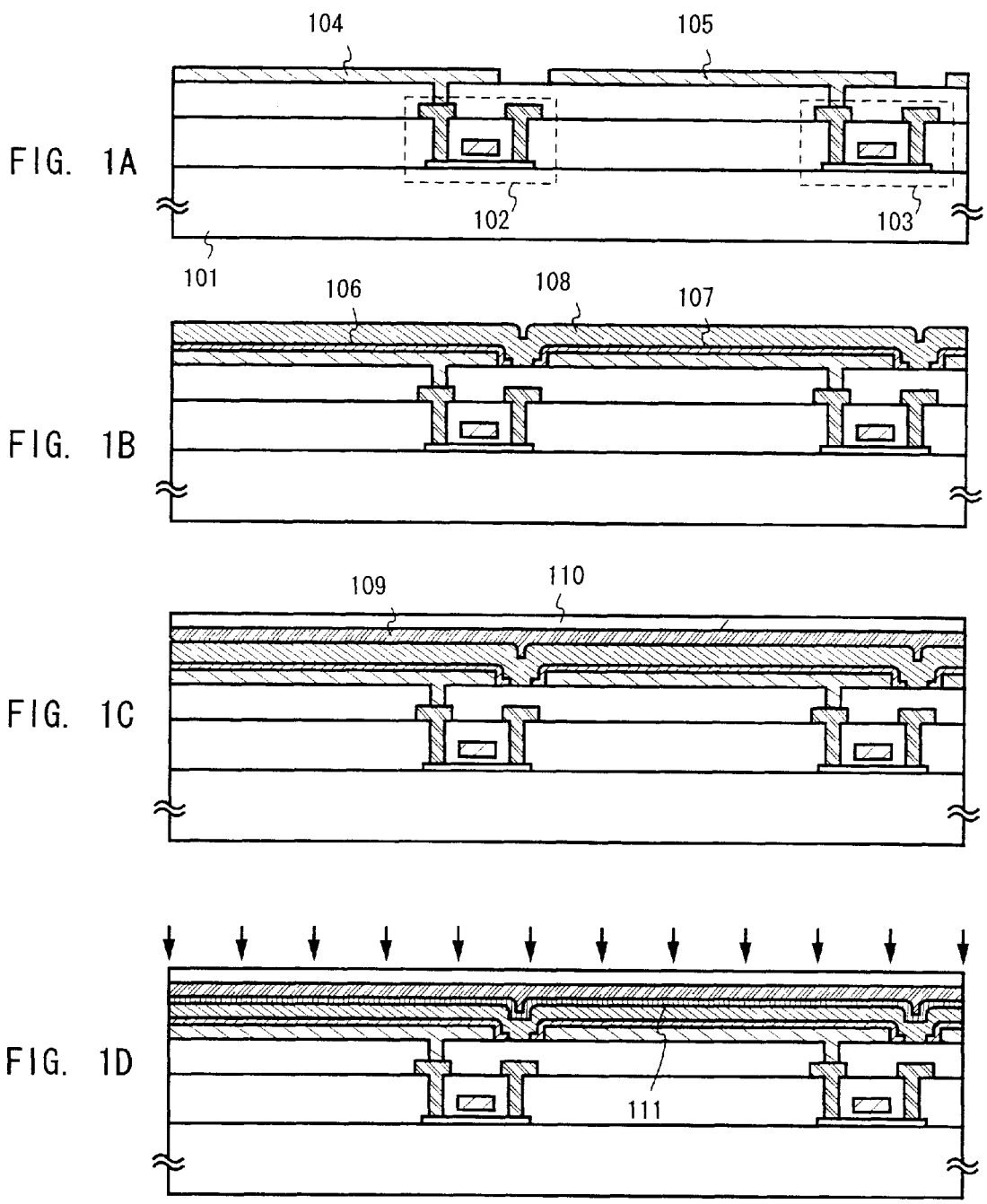

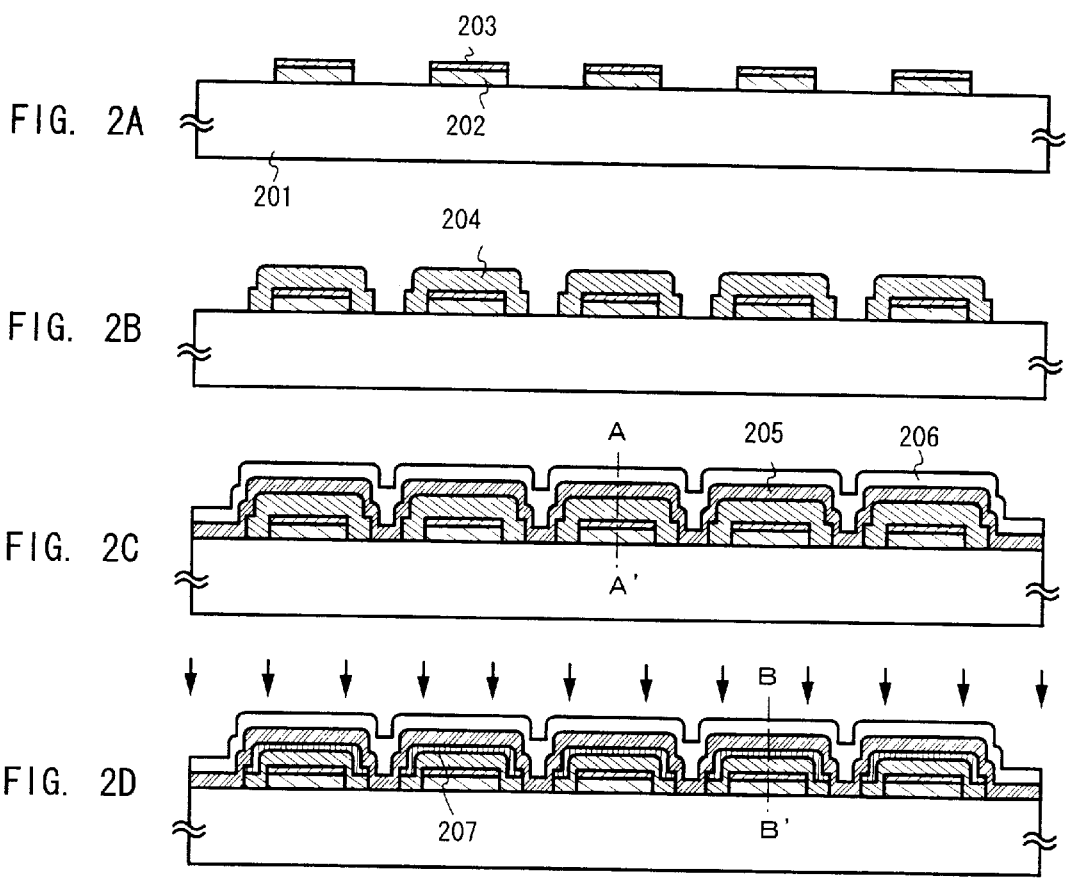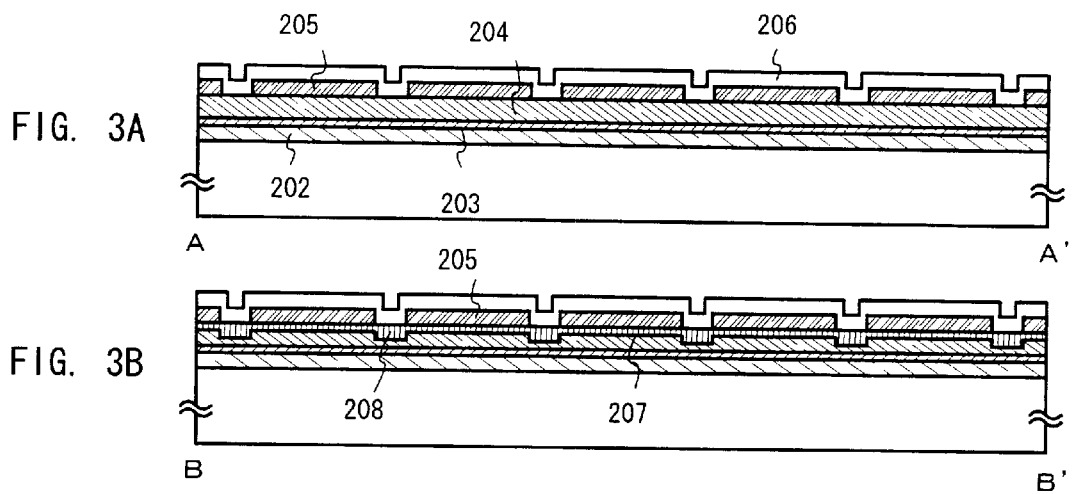

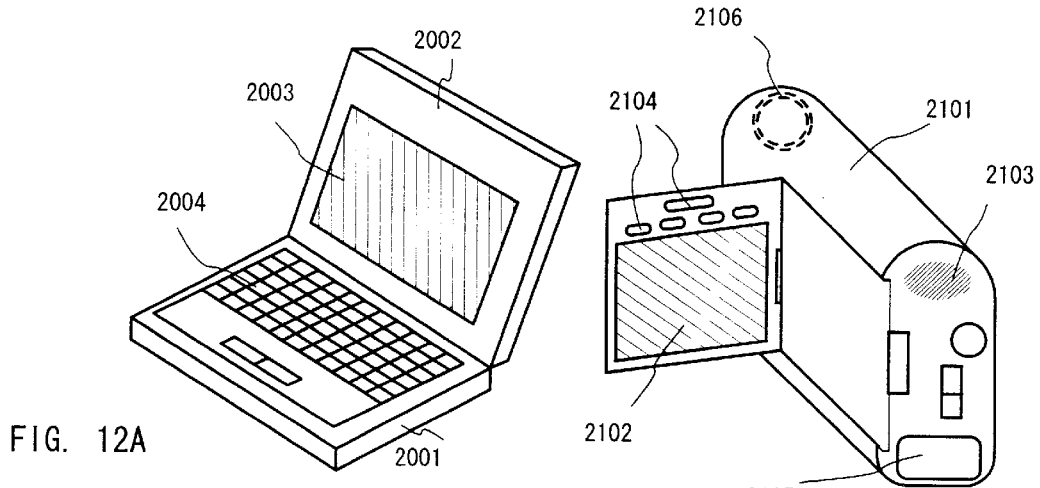
FIG. 12A
FIG. 12B
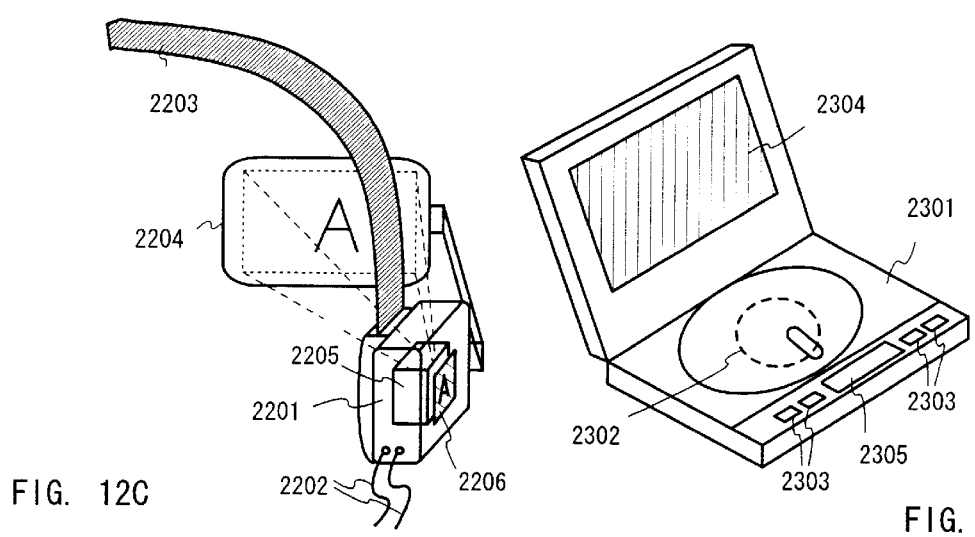
FIG. 12C
FIG. 12D
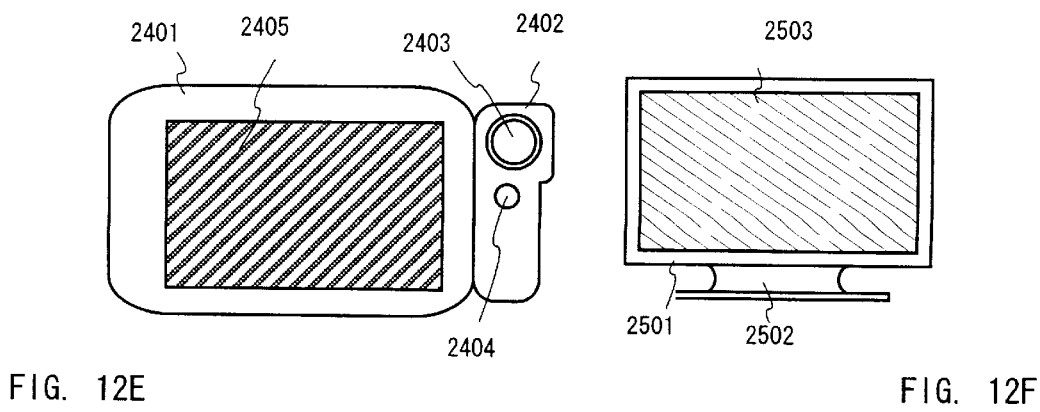
FIG. 12E
FIG. 12F

EL DISPLAY DEVICE AND METHOD OF MANUFACTURING THE SAME

BACKGROUND OF THE INVENTION

1. Field of the Invention

The present invention relates to an electro-optical device represented by an EL (electroluminescence) display device comprising a semiconductor element (an element using a semiconductor thin film, typically, a thin film transistor) that is formed on a substrate, and to an electronic device (electronic equipment) having the electro-optical device as a display. Specifically, the invention relates to a method of manufacturing these devices.

2. Description of the Related Art

In recent years, remarkable progress has been made in a technique for forming a thin film transistor (hereinafter referred to as a TFT) on a substrate, and developing the application of TFTs to active matrix type display devices is proceeding. TFTs using a polysilicon film, in particular, have a higher electric field mobility than that of conventional TFTs using an amorphous silicon film, and hence are capable of high speed operation. Accordingly, control of pixels, which in the past has been made by driver circuits outside the substrate, now can be made by driver circuits formed on the same substrate on which the pixels are formed.

The attention is kept drawn to such active matrix type display devices in expectation of various advantages, such as lowering of production cost, downsizing of display devices, and an increase in yield and throughput, as a result of putting all the various kinds of circuits and elements onto the same single substrate.

In active matrix type EL display devices, every pixel is provided with a switching element formed of a TFT, and an EL layer emits light when a drive element that controls current is operated by this switching element. The mainstream at present of the structure of the EL layer is the layered structure with three or four layers, proposed by Tang, et al. from Eastman Kodak Company.

Lately, however, many are concerned that multi-layering of the element structure will invite complication of the manufacture process and increase of the production cost. Attempts have been made in this connection to reduce the number of layers by doping a light emitting layer with a specific impurity element and using it as an electron conveying layer or an electron injection layer.

For instance, Idemitsu Kosan, Co. Ltd. proposes doping the light emitting layer (distylarylene derivative) near its surface with cesium (Cs) that has a small work function to use the doped region as the electron conveying layer. (Preliminaries for the Sixth FPD Seminar, sponsored by Electronic Journal, pp. 83–88)

SUMMARY OF THE INVENTION

The present invention has been made in view of the problem in multi-layering of the EL element, mentioned above, and an object of the present invention is therefore to provide a technique for reducing the number of the layers while keeping, or improving the performance of the EL element. More specifically, the present invention aims at providing a novel method of manufacturing an EL display device of the type that emits light from one side of a substrate where the element is formed.

Another object of the present invention is to reduce production cost so that an inexpensive EL display device is provided. Still another object of the present invention is to reduce product cost of an electronic device (electronic equipment) having the inexpensive EL display device as its display.

According to the present invention, a light emitting layer is doped with a specific impurity element to make the doped region function as a carrier conveying layer (or a carrier injection layer), thereby reducing the number of the layers in the light emitting layer of the EL element.

Specifically, the light emitting layer in the vicinity of an anode is doped with a halogen element in order to encourage the conveyance of holes. On the other hand, the light emitting layer in the vicinity of a cathode is doped with an alkali metal element or an alkaline earth metal element in order to encourage the conveyance of electrons. Ion doping that involves mass separation, or ion implantation that does not, may be used at the doping step of the impurity element.

The present invention is characterized in that doping of the above specific impurity element is carried out under a state in which no factors are found that might possibly invite degradation of the light emitting layer. To elaborate, the light emitting layer is doped with the specific impurity element while avoiding exposure to the open air (especially, oxygen). The conveyance of the holes or the electrons are thus improved without causing degradation of the light emitting layer.

As a typical example, an EL element consisting of a cathode, a light emitting layer and an anode layered in order from the bottom is doped with an impurity element through a passivation film formed on the anode. In this case, it is desirable that the process of from forming the cathode to forming the passivation film is completed without exposing the element to the open air not even once. An appropriate apparatus to achieve this is a thin film forming apparatus of multi-chamber system (also called cluster tool system) where various kinds of processing chambers are integrated, or a thin film forming apparatus of in-line system.

BRIEF DESCRIPTION OF THE DRAWINGS

In the accompanying drawings:

FIGS. 1A to 1D are diagrams showing a process of manufacturing an EL display device;

FIGS. 2A to 2D are diagrams showing a process of manufacturing an EL display device;

FIGS. 3A and 3B are diagrams showing a process of manufacturing an EL display device;

FIGS. 12A to 12F are diagrams showing examples of an electronic device.

DETAILED DESCRIPTION OF THE PREFERRED EMBODIMENTS

[Embodiment 1]

An embodiment of the present invention will be described with reference to FIGS. 1A to 1D. First, TFTs 102, 103 are formed on a substrate 101 using a known method. Though any substrate may be employed as the substrate 101, a glass substrate, a ceramic substrate, a plastic substrate, and a stainless steel substrate are preferred. (FIG. 1A)

The TFTs 102, 103 may take any structure. However, since they are TFTs that control current flowing into pixel electrodes 104, 105, a structure that can lessen degradation by heat generation and by hot carrier effect is desirable. On the other hand, too much current generates heat to degrade the EL layer, and therefore, in some cases, channel length is extended or a resistor is placed in order to suppress an excessive current.

Note that, though FIGS. 1A to 1D illustrate the TFT as if only one TFT is formed in one pixel, actually, two TFTs, one is a switching TFT and the other is a current controlling TFT (this one is the TFT shown in FIGS. 1A to 1D) are provided. The arrangement of the respective TFTs may follow the illustration of FIG. 1 (where the TFTs are denoted by T1 and T2) disclosed in Japanese Patent Application Laid-open No. Hei 8-241048.

The pixel electrodes 104, 105 are formed of a material having high reflectivity. Specifically, a material containing aluminum as a main ingredient (containing 50 wt % or more aluminum) is preferable. Of light beams emitted from the EL element, one that travels toward the substrate 101 side is almost entirely reflected at the pixel electrodes 104, 105 and exits therefrom.

Figure 9:
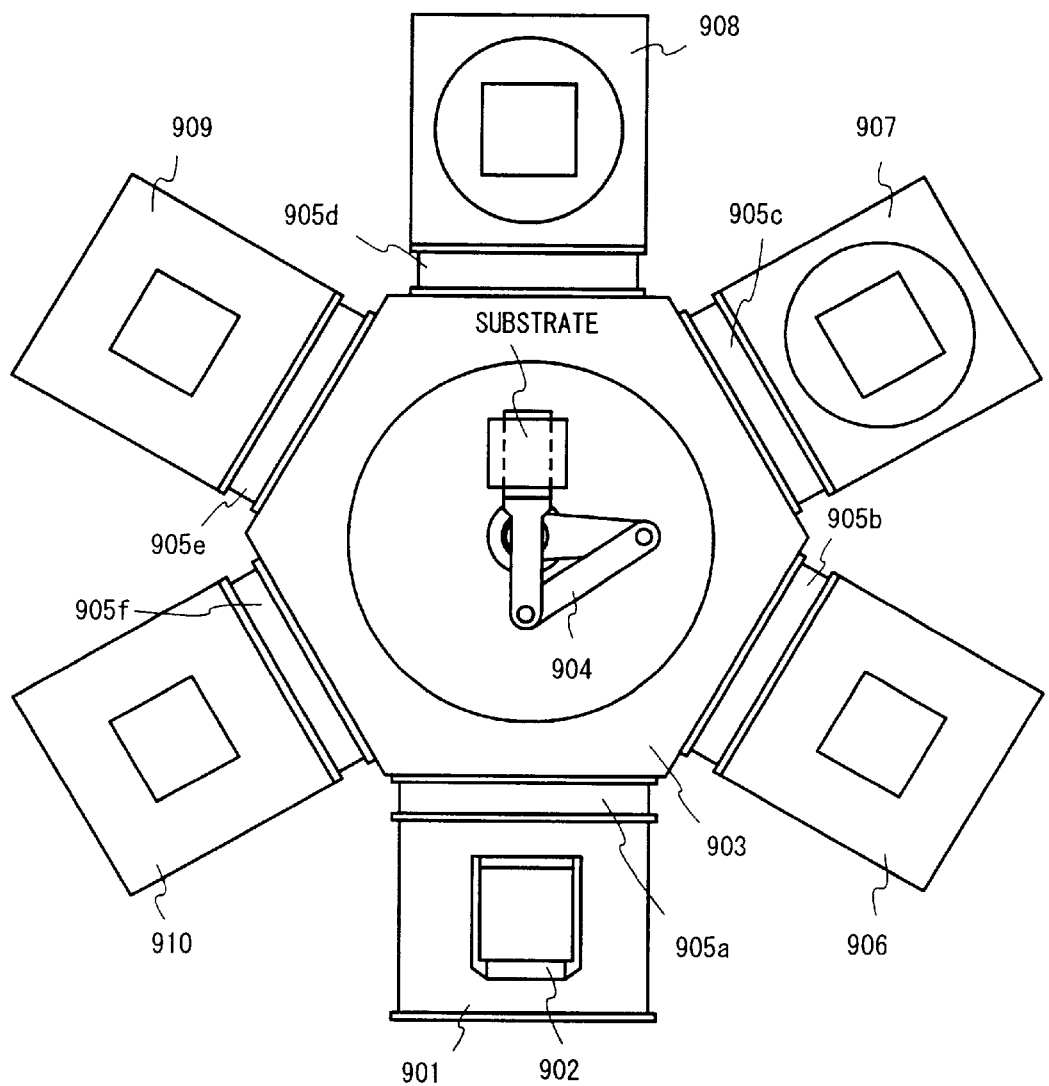
FIG. 9 is a diagram showing the structure of a thin film forming apparatus.

Next, the EL element will be formed using a thin film forming apparatus shown in FIG. 9. In FIG. 9, reference symbol 901 denotes a loading chamber for loading and unloading the substrate which is also called a load lock chamber. A carrier 902 in which the substrate shown in FIG. 1A is set is arranged in this chamber. The loading chamber 901 may be divided into a substrate loading chamber and a substrate unloading chamber.

Reference symbol 903 denotes a common chamber including a mechanism 904 for transferring the substrate (hereinafter referred to as a transferring mechanism). The common chamber 903 communicates with a plurality of processing chambers (denoted by 906 to 910) through gates 905a to 905f, respectively.

The respective processing chambers are completely closed off to the common chamber 903 by the gates 905a to 905f, providing air-tight spaces. Accordingly, the processing can be made in vacuum if an exhaust pump is provided in each processing chamber. Usable exhaust pumps may be a hydraulic rotary pump, a mechanical booster pump, a turbomolecular pump, and a cryopump, of which the cryopump is preferred because it is effective in discharging moisture.

The substrate is transferred first to the common chamber 903 by the transferring mechanism 904, and then to a first vapor phase film formation processing chamber 906. In the first vapor phase film formation processing chamber 906, cathodes 106, 107 are formed from a metal film containing an alkali metal element, or an alkaline earth metal element. Either evaporation or sputtering may be employed to form the film. In this embodiment, an MgAg alloy obtained by joint evaporation of magnesium and silver at a ratio of 10:1 is used.

Being formed on the pixel electrodes 104, 105 that are connected to the TFTs, the cathodes 106, 107 can receive current output from the TFTs 102, 103. In short, the cathodes 106, 107 can establish electrical connection with the TFTs 102, 103.

The substrate is then transferred from the first vapor phase film formation processing chamber 906 to a solution application processing chamber 907. In the solution application processing chamber 907, a solution containing an EL material is applied by spin coating to form a polymer precursor that contains a polymer-based EL material. In this embodiment, a solution in which polyvinyl carbazole is dissolved in chloroform is used as the solution containing an EL material. It is of course possible to use other polymer-based EL material (typically, polyphenylene vinylene, polycarbonate, etc.) and other organic solvent (typically, dichloromethane, tetrahydrofuran, etc.) in combination.

Subsequently, the substrate is transferred from solution application processing chamber 907 to a calcination processing chamber 908. In the calcination processing chamber 908, the EL material is polymerized by calcination processing (heat treatment). In this embodiment, a stage is heated by a heater so that the heat treatment is performed on the entire substrate at a temperature of 50 to 150° C. (preferably, 110 to 120° C.). Excess chloroform is thus volatilized, forming a polymer-based light emitting layer 108 made of polyvinyl carbazole. (FIG. 1B) Next, the substrate is transferred from the calcination processing chamber 908 to a second vapor phase film formation processing chamber 909. An anode 109 is formed therein from a transparent conductive film by sputtering or evaporation on the polymer-based light emitting layer 108. For the anode 109, a transparent conductive film made of, for example, a compound of indium oxide and tin oxide (ITO) or a compound of indium oxide and zinc oxide may be used. A compound obtained by mixing 10 to 15% zinc oxide with indium oxide is used in this embodiment.

The substrate is then transferred from the second vapor phase film formation processing chamber 909 to a third vapor phase film formation processing chamber 910. A passivation film 110 is formed in there from an insulating film or, preferably, an insulating film containing silicon by sputtering or evaporation. The passivation film 110 is provided to protect the light emitting layer 108 from moisture and oxygen. Accordingly, a silicon nitride film or a silicon nitride oxide film which contains almost no oxygen is preferred for the passivation film.

As the passivation film 110, an insulating film may be used which contains Si (silicon), Al (aluminum), N (nitrogen), O (oxygen), and M (M is at least one member of the rare earth elements, preferably, at least one element selected from Ce (cerium), Yb (ytterbium), Sm (samarium), Er (erbium), Y (yttrium), La (lanthanum), Gd (gadolinium), Dy (dysprosium), and Nd (neodymium)).

In this way, the state shown in FIG. 1C is obtained. After that the substrate is transferred from the third vapor phase film formation processing chamber 910 to the carrier 902 placed in the loading chamber 901. A series of processing using the thin film forming apparatus shown in FIG. 9 is thus completed.

An advantage of using the thin film forming apparatus shown in FIG. 9 is that the process of from forming the cathode 106 to forming the passivation film 110 can be carried out continuously without exposing the substrate to the air (moisture, especially) not even once. In other words, all the processes are carried out in vacuum or in an inert gas atmosphere, so that degradation of the light emitting layer is not caused.

In addition, the thin film forming apparatus is also provided with a processing chamber for spin coating, which makes it possible to form an EL element using a polymer-based EL material. It is also possible to form the light emitting layer 108 by evaporation or sputtering, of course.

After thus obtaining the state shown in FIG. 1C, doping of an impurity element is then performed through the passivation film 110 and the anode 109. In this embodiment, a halogen element (typically, fluorine, chlorine, bromine, or iodine) is the dopant. At this point, the doping is made such that the concentration of halogen element is the highest in the vicinity of the interface between the anode 109 and the light emitting layer 108. The vicinity of the interface between the anode and the light emitting layer refers to the extent 100 nm (typically 50 nm) down the depth of the light emitting layer from the interface between the anode and the light emitting layer. It causes no trouble if the halogen element is contained in the anode. (FIG. 1D)

The thus formed region 111 doped with the halogen element serves as a region for facilitating movement of carriers (holes, in this case) from the anode 109 to the light emitting layer 108, enhancing the light emission efficiency. That is, the region 111 functions substantially as a hole conveying layer (or a hole injection layer). Regions as such are therefore referred to as hole conveying regions in this specification.

Accordingly, the need for separately forming a hole conveying layer on the light emitting layer 108 is eliminated, simplifying the manufacture process of the EL display device. Also, the present invention has an advantage in that there is no fear of degrading the light emitting layer 108 because the impurity element doping step is not carried out until formation of films up through the passivation film is finished.

[Embodiment 2]

This embodiment will be described with reference to FIGS. 2A to 2D. First, an auxiliary electrode 202 and a cathode 203 are formed on a substrate 201. The electrode and the cathode are selectively and continuously layered by evaporation or sputtering while using a mask. Though not shown in FIG. 2A, there are formed a plurality of electrodes which extend in the depth direction of the space defined in the drawing, forming stripes.

The auxiliary electrode 202 is an electrode formed of a material mainly containing aluminum, copper or silver, and having a very low resistivity. In this embodiment, an MgAg alloy is used as the cathode 203 with a low resistance electrode layered thereon as an auxiliary to enhance the conductivity, thereby reducing the film thickness. This low resistance electrode is therefore referred to as the auxiliary electrode.

Then a light emitting layer 204 is formed so as to cover the auxiliary electrode 202 and the cathode 203. In this embodiment, $Alq_3$ (tris-8-chinolinato-aluminum), which is a monomer-based EL material, is selectively formed by evaporation using a mask. (FIG. 2B)

Subsequently, an anode 205 is formed from a transparent conductive film into stripe form so as to be perpendicular to the cathode 203. Evaporation or sputtering using a mask is appropriate for this film formation. A compound obtained by mixing tin oxide or zinc oxide with indium oxide is used as the anode 205 in this embodiment.

A passivation film 206 is formed next to cover the anode 205. In this embodiment, a silicon nitride film is formed as the passivation film 206 onto the entire surface. Other insulating films, as mentioned in Embodiment 1, may of course be used instead. The sectional view of the device in the state of FIG. 2C, taken along the line A–A', is shown in FIG. 3A.

After the state shown in FIG. 2C is obtained, the device is doped with a halogen element through the passivation film 206 and the anode 205. At this point, similar to Embodiment 1, the doping is made such that the concentration of the halogen element is the highest in the vicinity of the interface between the anode 205 and the light emitting layer 204. As a result, a hole conveying region 207 is formed in the vicinity of the interface between the anode 205 and the light emitting layer 204 to enhance the light emission efficiency. (FIG. 2D)

The sectional view of the device in the state of FIG. 2D, taken along the line B–B', is shown in FIG. 3B. However, a region denoted by 208 is doped with the halogen element at a deeper level as compared with the area right beneath the anode 205, for the region 208 is in between the anode 205 and the adjacent anode 205.

As described above, according to this embodiment, the need for separately forming a hole conveying layer on the light emitting layer 204 is eliminated, simplifying the manufacture process of the EL display device. Also, the present invention has an advantage in that there is no fear of degrading the light emitting layer 204 because the impurity element doping step is not carried out until formation of films up through the passivation film is finished.

[Embodiment 3]

This embodiment gives a description of the case where the impurity element used for doping in Embodiment 1 is changed to other elements. The symbols used in Embodiment 1 will be referred when necessary.

Figure 4:
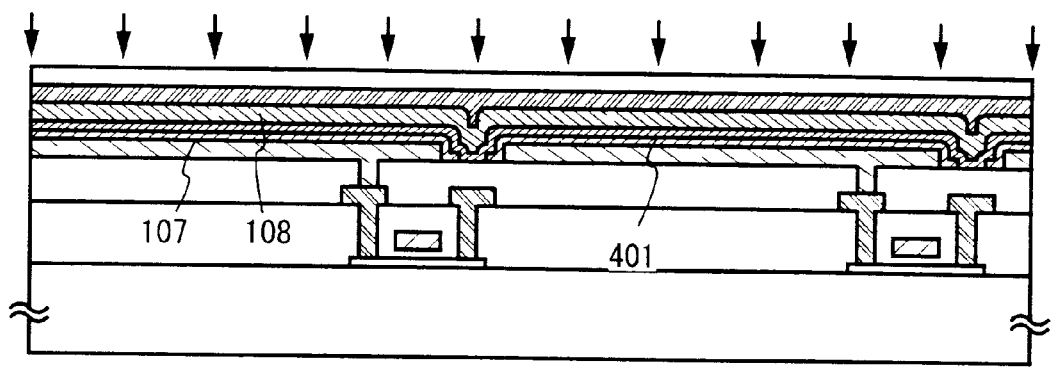
FIG. 4 is a diagram showing a process of manufacturing an EL display device.

First, following the steps of Embodiment 1, the state shown in FIG. 1C is obtained. A doping step of an impurity element is then carried out as shown in FIG. 4. In this embodiment, the vicinity of the interface between the cathode 107 and the light emitting layer 108 is doped with an alkali metal element, typical examples of which include Li (lithium), Na (sodium), K (potassium), and Cs (cesium), or an alkaline earth metal element, typical examples of which include Be (beryllium), Mg (magnesium), Ca (calcium), and Ba (barium). The vicinity of the interface between the cathode and the light emitting layer here refers to an extent 100 nm (typically, 50 nm) up in the depth direction of the light emitting layer from the interface between the cathode and the light emitting layer. It causes no trouble if the alkali metal element or the alkaline earth metal element is contained in the cathode.

The thus formed region 401 doped with the alkali metal element or the alkaline earth metal element serves as a region for promoting movement of carriers (electrons, in this case) from the cathode 107 to the light emitting layer 108. That is, the region 401 functions substantially as an electron conveying layer (or an electron injection layer). Regions as such are therefore referred to as electron conveying regions in this specification.

As described above, the need for separately forming an electron conveying layer below the light emitting layer 108 is eliminated, simplifying the manufacture process of the EL display device. Also, the present invention has an advantage in that there is no fear of degrading the light emitting layer 108 because the impurity element doping step is not carried out until formation of films up through the passivation film is finished.

This embodiment may be combined with Embodiment 1. To elaborate, if the two embodiments are combined, the vicinity of the interface between the light emitting layer 108 and the anode 109 is doped with the halogen element to form the hole conveying region while the vicinity of the interface between the light emitting layer 108 and the cathode 107 is doped with the alkali metal element or the alkaline earth metal element to form the electron conveying region.

[Embodiment 4]

This embodiment gives a description of the case where the impurity element used for doping in Embodiment 2 is changed to other elements. The symbols used in Embodiment 2 will be referred when necessary.

Figure 5:
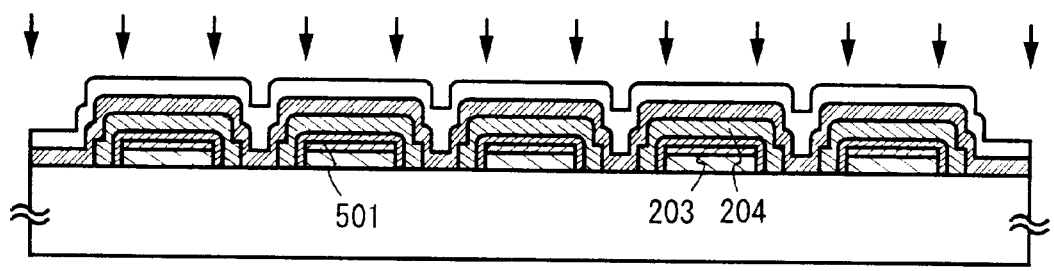
FIG. 5 is a diagram showing a process of manufacturing an EL display device.

First, following the steps of Embodiment 2, the state shown in FIG. 2C is obtained. A doping step of an impurity element is then carried out as shown in FIG. 5. In this embodiment, the vicinity of the interface between the cathode 203 and the light emitting layer 204 is doped with an alkali metal element, typical examples of which include Li (lithium), Na (sodium), K (potassium), and Cs (cesium), or an alkaline earth metal element, typical examples of which include Be (beryllium), Mg (magnesium), Ca (calcium), and Ba (barium). That the vicinity of the interface between the cathode 203 and the light emitting layer 204 is doped is the same as Embodiment 2. As a result, an electron conveying region 501 is formed.

As described above, the need for separately forming an electron conveying layer below the light emitting layer 204 is eliminated, simplifying the manufacture process of the EL display device. Also, the present invention has an advantage in that there is no fear of degrading the light emitting layer 204 because the impurity element doping step is not carried out until formation of films up through the passivation film is finished.

This embodiment may be combined with Embodiment 2. To elaborate, if the two embodiments are combined, the vicinity of the interface between the light emitting layer 204 and the anode 205 is doped with the halogen element to form the hole conveying region while the vicinity of the interface between the light emitting layer 204 and the cathode 203 is doped with the alkali metal element or the alkaline earth metal element to form the electron conveying region.

[Embodiment 5]

An example of an EL display device is shown in this embodiment in which a light emitting region is distinguished from a non-light emitting region by using the present invention to control positions for forming a hole conveying region and an electron conveying region.

Figure 6A:
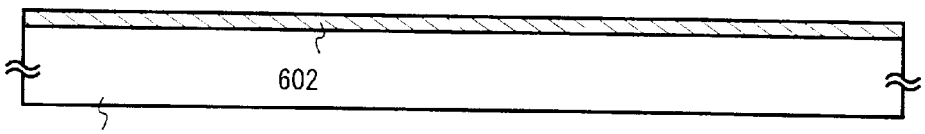
FIGS. 6A to 6D are diagrams showing a process of manufacturing an EL display device.

First, a substrate 601 is put into a carrier 902 of a thin film forming apparatus shown in FIG. 9, and the carrier 902 carrying the substrate is set in a loading chamber 901. The substrate 601 is then transferred to a first vapor phase film formation processing chamber 906 to form a cathode 602 by evaporation from an Al—LiF alloy. The Al—LiF alloy is obtained by joint evaporation of aluminum (Al) and lithium fluoride (LiF). (FIG. 6A)

Figure 6B:
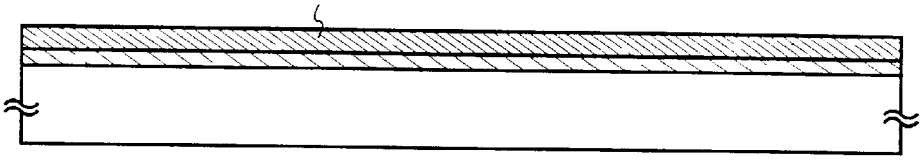

The substrate is then transferred to a solution application processing chamber 907. There, a solution in which polyphenylene vinylene is dissolved in dichloromethane is applied to the substrate by spin coating to form a polymer precursor. The substrate is further transferred to a calcination processing chamber 908. There, heat treatment is performed for polymerization, to thereby form a light emitting layer 603 of polyphenylene vinylene. (FIG. 6B)

Next, the substrate is transferred to a second vapor phase film formation processing chamber 909. An anode 604 is formed in there from a compound of indium oxide and zinc oxide. The substrate is further transferred to a third vapor phase film formation processing chamber 910. A passivation film 605 is formed in there from a silicon nitride film. (FIG. 6C)

Figure 6C:
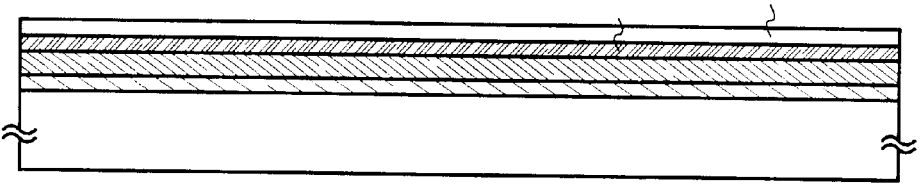

After the state shown in FIG. 6C is obtained, the substrate is returned to the loading chamber 901 and taken out from the thin film forming apparatus. The process of from forming the cathode 602 to forming the passivation film 605 is continuously carried out without exposing the device to the air not even once. All of the thin films are formed on the entire surface of the substrate without using a mask or the like.

Figure 6D:
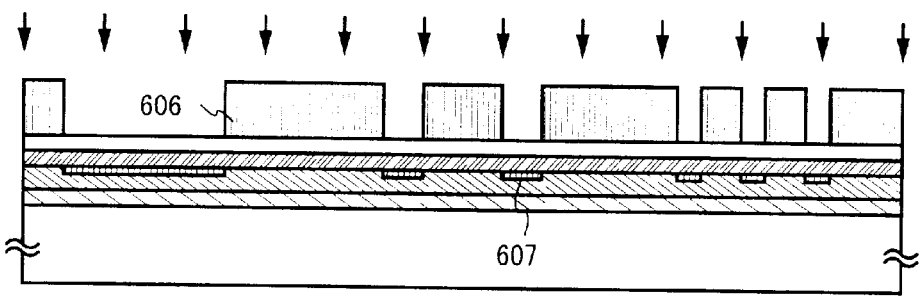

A resist 606 is then formed on the passivation film 606, and a doping step of an impurity element is carried out in this state. A halogen element is used in this embodiment as the impurity element to dope the vicinity of the interface between the light emitting layer 603 and the anode 604. A hole conveying region 607 is thus selectively formed in the light emitting layer 603. (FIG. 6D) In this embodiment, the hole conveying region 607 is selectively formed in the vicinity of the light emitting layer 603 and the anode 604. When the voltage is applied to the light emitting layer 603, only a portion where the hole conveying region 607 is formed emits light. In other words, a driving voltage of an EL element in this embodiment is adjusted so that the light emitting layer 603 emit no light by itself, or emit light with extremely low brightness. Further adjustment is made so that the portion where the hole conveying region 607 is formed emits light with a sufficient brightness by the same driving voltage. The contrast ratio of the brightness of the emitted light is adjusted such that the brightness of the region where the hole conveying region 607 is formed is $10^3$ or more (preferably $10^4$ or more) times the brightness of the region where the hole conveying region 607 is not formed.

Figure 8A:
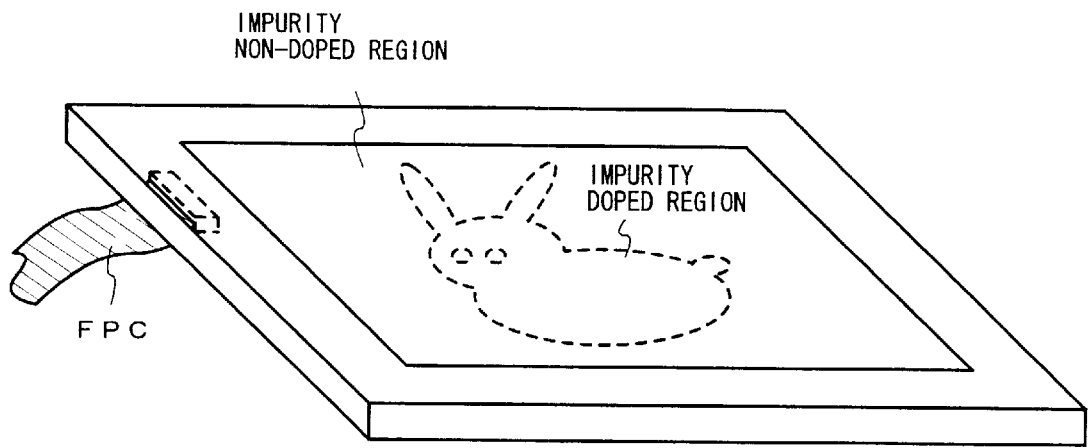
FIGS. 8A and 8B are diagrams showing the state of an EL display device before and after emitting light.
Figure 8B:
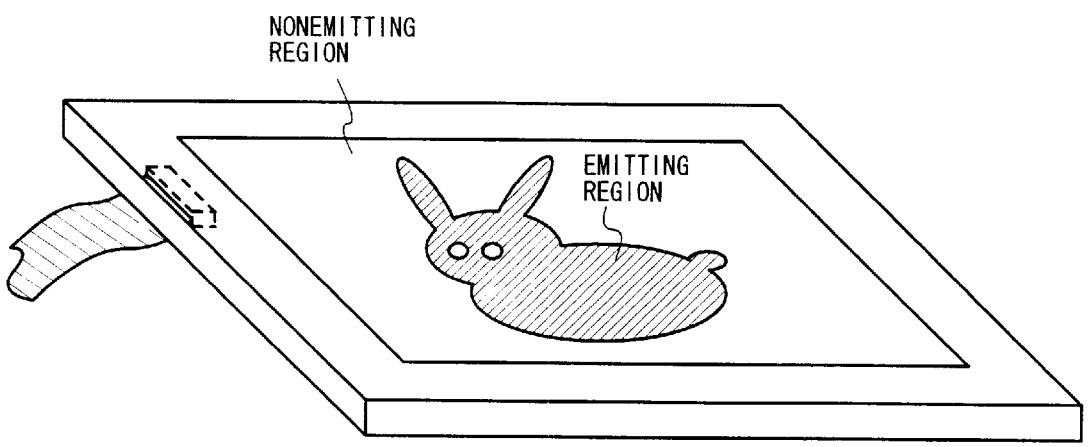

FIGS. 8A and 8B illustrate an outline of the light emission in this display device. FIG. 8A shows the state before the voltage is applied to the light emitting layer. In the drawing, the inside of a figure drawn by the dotted line is a region doped with an impurity element (a halogen element, in this embodiment) while the periphery of the figure is a region that is not doped with the impurity element.

The state after the voltage is applied to the light emitting layer is shown in FIG. 8B. The region doped with the impurity element in FIG. 8A emits light, so that the region can be visually recognized as a light emitting region. On the other hand, the region that is not doped with the impurity element in FIG. 8A does not emit light regardless of the application of voltage.

As described above, according to this embodiment, selective light emission only from the hole conveying region can be obtained by doping of the halogen element. That is, distinguishing a light emitting region from a non-light emitting region by photolithography technique is made possible. Also, this embodiment requires patterning only once during the process. In other words, there is no need for patterning the anode or the cathode. The manufacture process is therefore very simple, providing an advantage of low production cost.

[Embodiment 6]

This embodiment gives a description of the case where the impurity element used for doping in Embodiment 5 is changed to other elements. The symbols used in Embodiment 5 will be referred when necessary.

Figure 7:
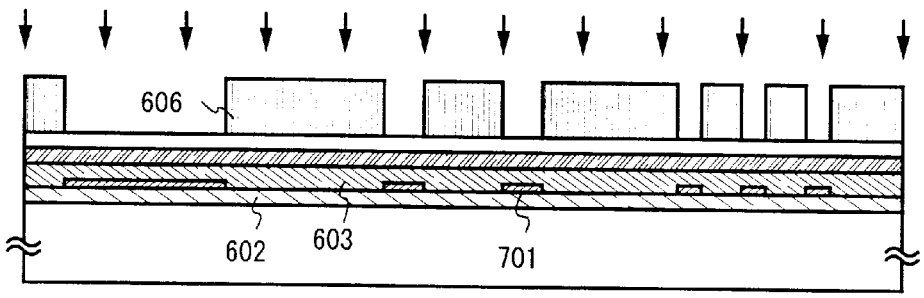
FIG. 7 is a diagram showing a process of manufacturing an EL display device.

First, following the steps of Embodiment 5, the state shown in FIG. 6C is obtained. A doping step of an impurity element is then carried out as shown in FIG. 7. In this embodiment, the vicinity of the interface between the cathode 602 and the light emitting layer 603 is doped with an alkali metal element or an alkaline earth metal element. The vicinity of the interface between the cathode 602 and the light emitting layer 603 is doped with the impurity element. As a result, an electron conveying region 701 is formed.

The selective light emission control as in Embodiment 5 can be attained also by this embodiment. That is, the selective light emission only by the portion where the electron conveying region 701 is possible according to this embodiment.

This embodiment may be combined with Embodiment 5. To elaborate, if the two embodiments are combined, the vicinity of the interface between the light emitting layer 603 and the anode 604 is doped with the halogen element to form the hole conveying region while the vicinity of the interface between the light emitting layer 603 and the cathode 602 is doped with the alkali metal element or the alkaline earth metal element to form the electron conveying region.

[Embodiment 7]

Figure 10:
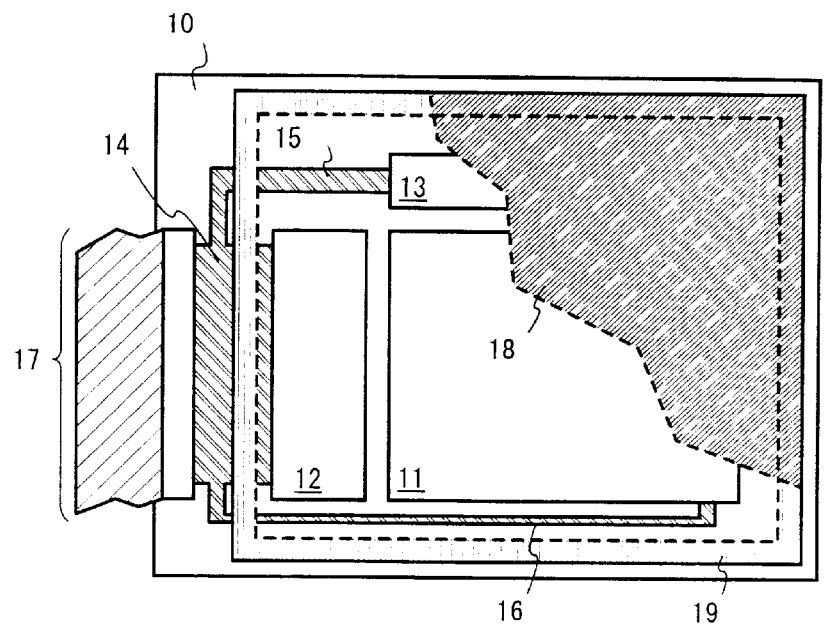
FIG. 10 is a diagram showing the structure of an EL display device.
Figure 11:
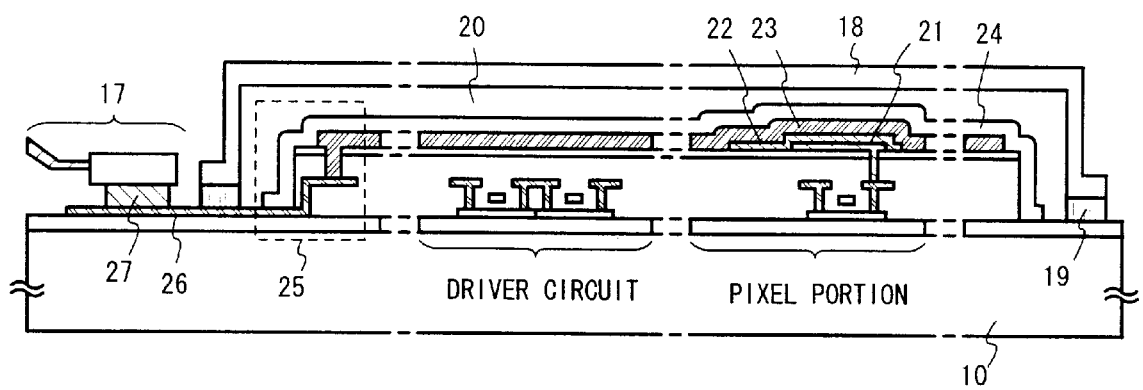
FIG. 11 is a diagram showing in section the structure of an EL display device.

This embodiment shows an example in which Embodiment 1 or 3 is applied to manufacture of an active matrix type EL display device where a pixel portion and its driver circuits are integrally formed on the same substrate. Reference is made to FIGS. 10 and 11 for explanation.

In FIG. 10, reference symbol 10 denotes a substrate, 11, a pixel portion, 12, a source side driver circuit, and 13, a gate side driver circuit. Wirings from the respective driver circuits are connected to external equipment through input/output wirings 14 to 16 and through an FPC 17. The wiring 14 is a wiring for sending a video signal, a clock signal, etc., to the source side driver circuit 12. The wiring 15 is a wiring for sending a clock signal or the like to the gate side driver circuit 13. The wiring 16 is a wiring for supplying the pixel portion 11 with the current to be fed to an EL element.

A sealing member (also called as a housing member) 18 is provided so as to cover at least the pixel portion, preferably, the driver circuits and the pixel portion. The sealing member 18 has a shape with a concave portion whose inner size (depth) is larger than the outer size (height) of the pixel portion 11, or is in a sheet form. An adhesive (also called as a sealant) 19 fixes the sealing member 18 to the substrate 10 so that the sealing member 18 and the substrate 10 together form an airtight space. At this point, the EL element reaches a state in which it is completely sealed in the airtight space, and access to the open air is completely cut off. The housing member 18 may be provided in plural numbers.

A preferred material for the sealing member 18 is an insulative substance such as glass or polymer. However, in a top view of FIG. 10, EL light is emitted toward the front of the drawing and, therefore, to use a light transmitting material is required. For example, amorphous glass (borosilicate glass, quartz, etc.), crystalized glass, ceramic glass, organic resins (acrylic resins, styrene-based resins, polycarbonate-based resins, epoxy-based resins, etc.), silicone-based resins can be named.

Epoxy-based resins, acrylate-based resins or the like may be used as the adhesive 19. Thermally curable resins or optically curable resins may also be used for the adhesive. However, to transmit as little amount of oxygen and moisture as possible is required for the material used as the adhesive 19.

A gap (a region denoted by 20 in FIG. 11) between the sealing member 18 and the substrate 10 is preferably filled with an inert gas (argon, helium, nitrogen, etc.). The filler is not necessarily limited to gas but may be an inert liquid (liquid fluoro carbon represented by perfluoroalkane, or the like) may also be used. Other appropriate inert liquid is disclosed in Japanese Patent Application Laid-open No. Hei 8-78519.

To put a drying agent in the gap 20 is also effective. As the drying agent, materials disclosed in Japanese Patent Application Laid-open No. Hei 9-148066 may be used. Barium oxide is typically used.

As shown in FIG. 11, a plurality of pixels each having an isolated EL element are formed in the pixel portion. After forming a pixel electrode 21, a light emitting layer 22 is formed by evaporation using a mask, and an anode 23 is formed thereon using another mask to fabricate the EL element having the sectional structure as shown in FIG. 11. In this embodiment, the pixel electrode (also serving as a cathode) 21, the light emitting layer 22, the anode 23, and a passivation film 24 are formed continuously using a thin film forming apparatus of multi-chamber type as shown in FIG. 9.

The anode 23 is connected to the input/output wiring 26 in a region denoted by reference symbol 25. The input/output wiring 26 is a power supply line for providing the anode 23 with a given voltage, and is connected to the FPC 17 through a conductive paste material 27.

The input/output wiring 26 is formed at the same time as source wirings and drain wirings of TFTs are formed. If the input/output wiring 26 is formed of a material mainly containing aluminum and an ITO film is used to form the anode 23, corrosion of aluminum may take place at a portion where the wiring comes into contact with the anode, which is unpreferable. In this case, the trouble of corrosion can be averted by using as the anode 23 a compound obtained by mixing indium oxide with zinc oxide.

The input/output wiring 26 passes through the gap (which is not hollow but filled with the adhesive 19: the adhesive therefore has to be poured to a thickness enough to flatten the level difference that is made by the input/output wiring) between the sealing member 18 and the substrate 10, and is connected to the FPC 17. Although description here takes the input/output wiring 26, the other input/output wirings 14 to 16 are similarly connected to the FPC 17 passing under the sealing member 18.

[Embodiment 8]

A struccture in which a source side driver circuit and a gate side driver circuit are formed in the periphery of a pixel portion is described in Embodiment 7. It is also possible to form the driver circuits in the pixel portion, which will be explained in this embodiment. In that case, all of light emitted from a light emitting layer exit from the opposite side of a substrate, creating deadspace, where no light can pass, between the substrate and a pixel electrode.

Therefore, any element or circuit may be formed in this deadspace without affecting display of images. To form the driver circuits in the deadspace thus makes it possible to reduce the size of the substrate even further.

Details of the basic concept of this embodiment is described in Japanese Patent Application No. Hei 11-182590, filed by the present applicant. The filed specification makes a complete reference for Embodiment 8 of the present invention.

[Embodiment 9]

EL display devices fabricated by implementing Embodiments 1 to 4 are of self-light emitting type, and hence are superior in visibility in a bright place to liquid crystal display devices. This is the reason why the devices of the present invention can be used as a direct-view type EL display.

Wide view angle may be named as one of advantages the EL displays hold over the liquid crystal displays. Accordingly, it is recommendable to employ an EL display that applies the present invention to a display (display monitor) of 30 inches or more in diagonal (typically, 40 inches or more), when watching a television broadcast on a large screen.

The present invention can be utilized not only as an EL display (a monitor for a personal computer, a monitor for receiving television broadcasting, a monitor for advertisement display, etc.) but also as a display for various kinds of electronic devices.

The electronic devices as such may include video cameras, digital cameras, goggle type displays (head mount diplays), navigation systems for automobiles, personal computers, video game machines integrated with displays, portable information terminals (mobile. computers, cellular phones, electronic books, etc.), and image reproducing devices provided with recording media (specifically, devices that are provided with a display capable of reproducing recording media such as compact discs (CDs), laser discs (LDs), and digital video discs (DVDs) and displaying images recorded therein). Examples of these electronic devices are shown in FIGS. 12A to 12F.

FIG. 12A shows a personal computer that is comprised of a main body 2001, a housing 2002, a display monitor 2003, and a keyboard 2004. The present invention can be used for the display monitor 2003.

FIG. 12B shows a video camera that is comprised of a main body 2101, a display monitor 2102, an audio input unit 2103, operation switches 2104, a battery 2105, and an image receiving unit 2106. The present invention can be used for the display monitor 2102.

FIG. 12C shows a part (right hand piece) of a head mount type EL display that is comprised of a main body 2201, signal cables 2202, a fixating band 2203, a display monitor 2204, an optical system 2205, and a display device 2206. The present invention can be used for the display device 2206.

FIG. 12D shows an image reproducing device provided with a recording medium (specifically, a DVD player) which is comprised of a main body 2301, a recording medium (CD, LD, DVD, or the like) 2302, operation switches 2303, a display monitor (a) 2304, and a display monitor (b) 2305. The display monitor (a) mainly displays image information while the display monitor (b) mainly displays character information. The present invention can be used for both the display monitors (a) and (b). Other image reproducing device provided with a recording medium, to which the present invention is applicable, includes a CD player, a game machine and the like.

FIG. 12E shows a portable (mobile) computer that is comprised of a main body 2401, a camera unit 2402, an image receiving unit 2403, an operation switch 2404, and a display monitor 2405. The present invention can be used for the display monitor 2405.

FIG. 12F shows an EL display that is comprised of a housing 2501, a support stand 2502, and a display monitor 2503. The present invention can be used for the display monitor 2503. Having wide view angles, the EL display is advantageous over a liquid crystal display in a large screen display, especially in a display whose diagonal line extends 10 inches or longer (more particularly, 30 inches or longer).

If the brightness of emitted light of EL materials is improved in future, it will become possible to use the present invenion for a front type or a rear type projector by enlarging and projecting, with the use of a lense or the like, light including image information that is output.

According to the present invention, the number of layers can be reduced while the performance of the EL element is kept or improved. The production cost of the EL display device can thus be reduced. In addition, An electronic device (electronic equipment) having such an inexpensive EL display device as a display may accordingly be decreased in product cost.

What is claimed is:

1. An EL display device comprising:
   a light emitting layer sandwiched between a cathode and an anode; and
   a passivation film formed on said anode,
   wherein a halogen element is contained in a portion of said light emitting layer, and
   wherein said portion is in contact with said anode.

2. A device according to claim 1, wherein said halogen element is contained in said anode.

3. A device according to claim 1, wherein said halogen element is contained in said passivation film.

4. A device according to claim 1, wherein said portion comprises a region containing the halogen element and a region not containing the halogen element.

5. A device according to claim 1, wherein said cathode comprises a metal film containing at least one of an alkali metal element and an alkaline earth metal element while said anode comprises a transparent conductive film.

6. A device according to claim 1, wherein said passivation film is an insulating film containing silicon.

7. A device comprising an EL display device according to claim 1.

8. A device according to claim 1, wherein said portion has a thickness of 100 nm or less.

9. A device according to claim 1, wherein said halogen element is doped through said passivation film.

10. An EL display device comprising:
    a TFT formed over a substrate;
    a light emitting layer sandwiched between an anode and a cathode; and
    a passivation film is formed on said anode,
    wherein said cathode is electrically connected to said TFT,
    wherein a halogen element is contained in a portion of said light emitting layer, and
    wherein said portion is in contact with said anode.

11. A device according to claim 10, wherein said halogen element is contained in said anode.

12. A device according to claim 10, wherein said halogen element is contained in said passivation film.

13. A device according to claim 10, wherein said portion comprises a region containing the halogen element and a region not containing the halogen element.

14. A device according to claim 10, wherein said cathode comprises a metal film containing at least one of an alkali metal element and an alkaline earth metal element while said anode comprises a transparent conductive film.

15. A device according to claim 10, wherein said passivation film is an insulating film containing silicon.

16. A device comprising an EL display device according to claim 10.

17. A device according to claim 10, wherein said portion has a thickness of 100 nm or less.

18. A. device according to claim 10, wherein said halogen element is doped through said passivation film.

19. An EL display device comprising:
    a light emitting layer sandwiched between a cathode and an anode; and
    a passivation film formed on said anode,
    wherein at least one of an alkali metal element and an alkaline earth metal element is contained in a portion of said light emitting layer,
    wherein said portion is in contact with said cathode, and
    wherein said at least one of the alkali metal element and the alkaline earth metal element is doped through said passivation film.

20. A device according to claim 19, wherein there are a region containing said at least one of the alkali metal element and the alkaline earth metal element and a region not containing the alkali metal element or the alkaline earth metal element in said passivation film.

21. A device according to claim 19, wherein said portion comprises a region containing said at least one of the alkali metal element and the alkaline earth metal element and a region not containing the alkali metal element or the alkaline earth metal element.

22. A device according to claim 19, wherein said cathode comprises a metal film containing at least one of an alkali metal element and an alkaline earth metal element while said anode comprises a transparent conductive film.

23. A device according to claim 19, wherein said passivation film is an insulating film containing silicon.

24. A device comprising an EL display device according to claim 19.

25. A device according to claim 19, wherein said portion has a thickness of 100 nm or less.

26. An EL display device comprising:
a TFT formed over a substrate;
a light emitting layer sandwiched between an anode and a cathode; and
a passivation film is formed on said anode,
wherein said cathode is electrically connected to said TFT,
wherein at least one of an alkali metal element and an alkaline earth metal element is contained in a portion of said light emitting layer,
wherein said portion is in contact with said anode, and
wherein said at least one of the alkali metal element and the alkaline earth metal element is doped through said passivation film.

27. A device according to claim 26, wherein there is a region containing said at least one of the alkali metal element and the alkaline earth metal element and a region not containing the alkali metal element or the alkaline earth metal element in said passivation film.

28. A device according to claim 26, wherein said portion comprises a region containing said at least one of the alkali metal element and the alkaline earth metal element and a region not containing the alkali metal element or the alkaline earth metal element in the vicinities of the interface between said light emitting layer and said cathode.

29. A device according to claim 26, wherein said cathode comprises a metal film containing at least one of an alkali metal element and an alkaline earth metal element while said anode comprises a transparent conductive film.

30. A device according to claim 26, wherein said passivation film is an film containing silicon.

31. A device comprising an EL display device according to claim 26.

32. A device comprising to claim 26, wherein said portion has a thickness of 100 nm or less.

33. An EL display device comprising:
a light emitting layer sandwiched between a cathode and an anode; and
a passivation film on said anode,
wherein a halogen element is selectively doped to said light emitting layer through said passivation film.

34. A device according to claim 33, wherein said halogen element is contained in said anode.

35. A device according to claim 33, wherein said halogen element is contained in said passivation film.

36. A device according to claim 33, wherein said cathode comprises a metal film containing at least one of an alkali metal element and an alkaline earth metal element while said anode comprises a transparent conductive film.

37. A device according to claim 33, wherein said passivation film is an insulating film containing silicon.

38. A device comprising an EL display device according to claim 33.

39. An EL display device comprising:
a light emitting layer sandwiched between a cathode and an anode; and a passivation film on said anode,
wherein at least one of an alkali metal element and an alkaline earth metal element is selectively doped to said light emitting layer through said passivation film.

40. A device according to claim 39, wherein said cathode comprises a metal film containing at least one of an alkali metal element and an alkaline earth metal element while said anode comprises a transparent conductive film.

41. A device according to claim 39, wherein said passivation film is an insulating film containing silicon.

42. A device comprising an EL display device according to claim 39.

43. An EL display device comprising:
a layer comprising an organic material between a cathode and an anode; and
a passivation film on said anode,
wherein said layer comprising a first portion and a second portion and said first portion is in contact with said anode,
wherein only said first portion comprises a halogen element, and
wherein at least said second portion functions as a light emitting layer.

44. A device according to claim 43, wherein said halogen element is contained in said anode.

45. A device according to claim 43, wherein said halogen element is contained in said passivation film.

46. A device according to claim 43, wherein said halogen element is doped through said passivation film.

47. A device according to claim 43, wherein said cathode comprises a metal film containing at least one of an alkali metal element and an alkaline earth metal element while said anode comprises a transparent conductive film.

48. A device according to claim 43, wherein said passivation film is an insulating film containing silicon.

49. A device comprising an EL display device according to claim 43.

50. An EL display device comprising:
a layer comprising an organic material between a cathode and an anode; and
a passivation film on said anode,
wherein said layer comprising a first portion and a second portion and said first portion is in contact with said anode,
wherein only said first portion comprises at least one of an alkali metal element and an alkaline earth metal element,
wherein at least said second portion functions as a light emitting layer, and
wherein said at least one of the alkali metal element and the alkaline earth metal element is doped through said passivation film.

51. A device according to claim 50, wherein said cathode comprises a metal film containing at least one of an alkali metal element and an alkaline earth metal element while said anode comprises a transparent conductive film.

52. A device according to claim 50, wherein said passivation film is an insulating film containing silicon.

53. A device according to claim 50, said device comprises an EL display device.

* * * * *